United States Patent [19]

Sugawa et al.

[11] Patent Number: 4,835,404
[45] Date of Patent: May 30, 1989

[54] PHOTOELECTRIC CONVERTING APPARATUS WITH A SWITCHING CIRCUIT AND A RESETTING CIRCUIT FOR READING AND RESETTING A PLURALITY OF LINES SENSORS

[75] Inventors: Shigetoshi Sugawa, Atsugi; Nobuyoshi Tanaka, Tokyo; Toshiji Suzuki, Machida; Akira Ishizaki, Yokohama, all of Japan

[73] Assignee: Canon Kabushiki Kaisha, Tokyo, Japan

[21] Appl. No.: 97,456

[22] Filed: Sep. 14, 1987

[30] Foreign Application Priority Data

Sep. 19, 1986 [JP] Japan ............................ 61-219669
Jan. 16, 1987 [JP] Japan ............................ 62-006254

[51] Int. Cl.$^4$ .......................................... H04N 3/14
[52] U.S. Cl. ............................ 250/578; 358/213.27; 358/213.18
[58] Field of Search .................... 250/211 J, 578; 358/213.18, 213.27, 213.29, 294

[56] References Cited

U.S. PATENT DOCUMENTS

| | | | |
|---|---|---|---|
| 3,814,846 | 6/1974 | Snow | 250/211 J |
| 4,591,916 | 5/1986 | Soneda et al. | 358/213.29 |
| 4,646,155 | 2/1987 | Miyazawa et al. | 358/213.18 |
| 4,686,554 | 8/1987 | Ohmi et al. | 357/30 |

Primary Examiner—David C. Nelms
Assistant Examiner—Stephone B. Allen
Attorney, Agent, or Firm—Fitzpatrick, Cella, Harper & Scinto

[57] ABSTRACT

A photoelectric converting device having a plurality of line sensors, each line sensor having an output line and scanning means for scanning that line sensor. Selection circuit selectably directs a signal from one of the plural output lines to a common output terminal. A reset device resets the common output line to a predetermined level in response to the scanning of the line after the signal has been directed to the common output terminal. The readout may be conducted by scanning the plurality of line sensors by alternatively scanning photoelectric conversion cells from different line sensors.

22 Claims, 8 Drawing Sheets

PHOTOELECTRIC CONVERTING APPARATUS WITH A SWITCHING CIRCUIT AND A RESETTING CIRCUIT FOR READING AND RESETTING A PLURALITY OF LINES SENSORS

BACKGROUND OF THE INVENTION

1. Field of the Invention

The present invention relates to a photoelectric converting apparatus of the type having a plurality of photosensors and a plurality of signal output lines for picking up signals from the photosensors, wherein the signals are picked up through signal output terminals smaller in number than that of the signal output lines.

2. Related Background Art

In order to read signals from the entirety or part of a color sensor made of a plurality of photosensors disposed one or two-dimensionally, it becomes necessary to provide a plurality of signal output lines.

FIG. 1 is a circuit diagram showing one example of a conventional photoelectric converting apparatus.

In the Figure, there are provided sensor line blocks 101 and 102 each constructed of one-dimensionally disposed photosensors Signals from each sensor line block are sequentially read via signal output lines 103 and 104 which are commonly connected to an amplifier 105 having a signal output terminal 106. During the reading of signals from one sensor line block, reading of signals from the other line sensor block is inhibited. Thus, signals from the two signal output lines can be read via the single output terminal, resulting in fewer numbers of wires for connection to external circuitry.

In operation of the above conventional photoelectric converting apparatus, signal from the sensor line blocks 101 and 102 are temporarily stored in charge storage capacitors or wiring capacitance C1 to Cn. Signals from the sensor line blocks 101 and 102 are sequentially picked up and transferred to the signal output lines 103 and 104, respectively under the control of shift registers. The signals are then outputted via the amplifier 105 at its signal output terminal 106

However, since the signal output lines 103 and 104 are connected together at the input terminal Of the amplifier, each of the wiring capacitances Cw1 and Cw2 of the signal output line are added together, resulting in a large capacitance on each signal output line. Thus, there arises a problem that the output of a signal stored, for example, in the charge storage capacitor C1 is reduced at the signal output line 103 by the large capacitance.

The above problem becomes more serious in the case of a large number of sensor lines and hence a large number of signal output lines.

SUMMARY OF THE INVENTION

It is therefore an object of the present invention to provide an image pickup device and apparatus eliminating the above-described prior art problem.

It is another object of the present invention to provide an image pickup device having a high degree of freedom in circuit design.

It is a further object of th present invention to provide a photoelectric converter with less reduction in signal output level.

It is another object of the present invention to provide an image pickup apparatus suitable for high resolution.

The above objects can be achieved in accordance with the embodiments of the present invention. In a photoelectric converting apparatus of the type having a plurality of photosensors and a plurality of signal output lines for picking up signals from the photosensors, wherein the signals are picked up through signal output terminals smaller in number than that of the signal output lines, the photoelectric converter is characterized, according to one aspect of the present invention, by apparatus wherein the signal output lines each have switch means for switching the signal output line and connecting a desired output line to a signal output terminal.

Since a plurality of selection means (scanning circuits such as shift registers) are provided, the drive frequency of selection means may use a lower frequency in the case where a high frequency operation becomes necessary for a great number of photosensors, thus enabling a high degree of freedom in circuit design, pattern design for semiconductor devices and the like.

Since each signal output line is connected to the signal output terminal via switch means, the wiring capacity of the signal output line from which a signal is picked up via the closed switch means can be greatly reduced by opening the other switch means. Therefore, reduction in signal level at the signal output line can be avoided, and an image pickup apparatus with a high resolution and high output can be easily realized.

Other objects and advantages of the present invention will become apparent from the following description when read in conjunction with the accompanying drawings.

DETAILED DESCRIPTION OF THE PREFERRED EMBODIMENTS

The embodiments of the present invention will be described in detail with reference to the accompanying drawings.

Figure 1:
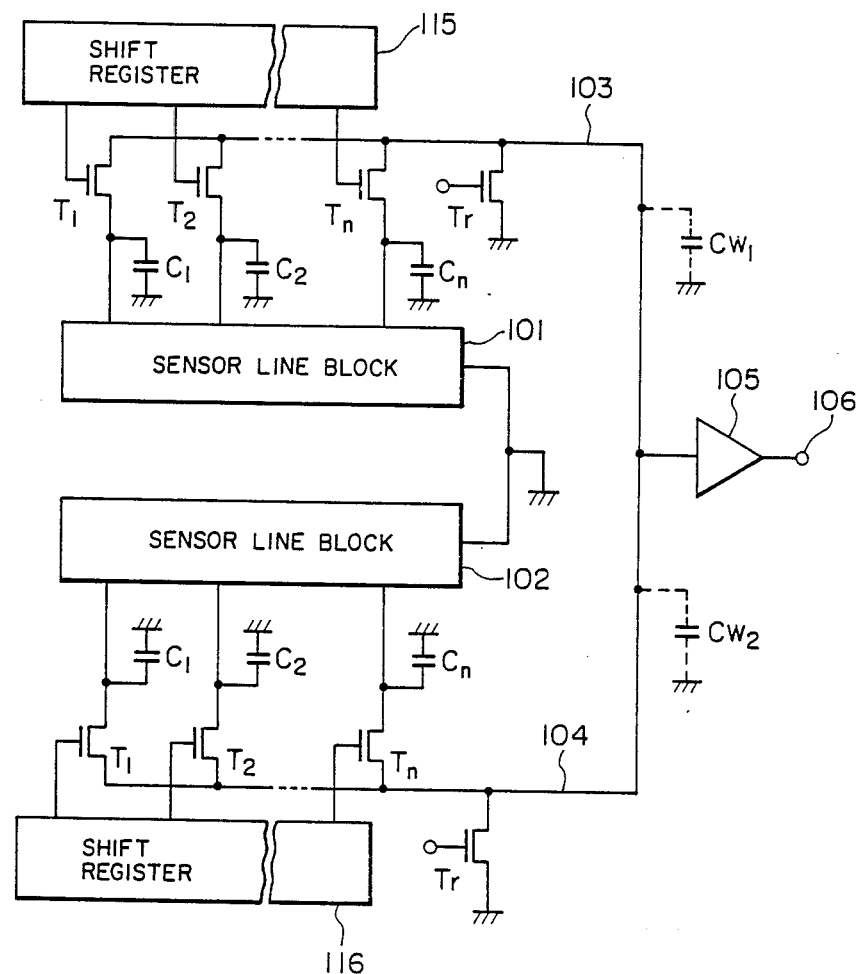
FIG. 1 is a circuit diagram showing an example of a conventional photoelectric converting apparatus.
Figure 2A:
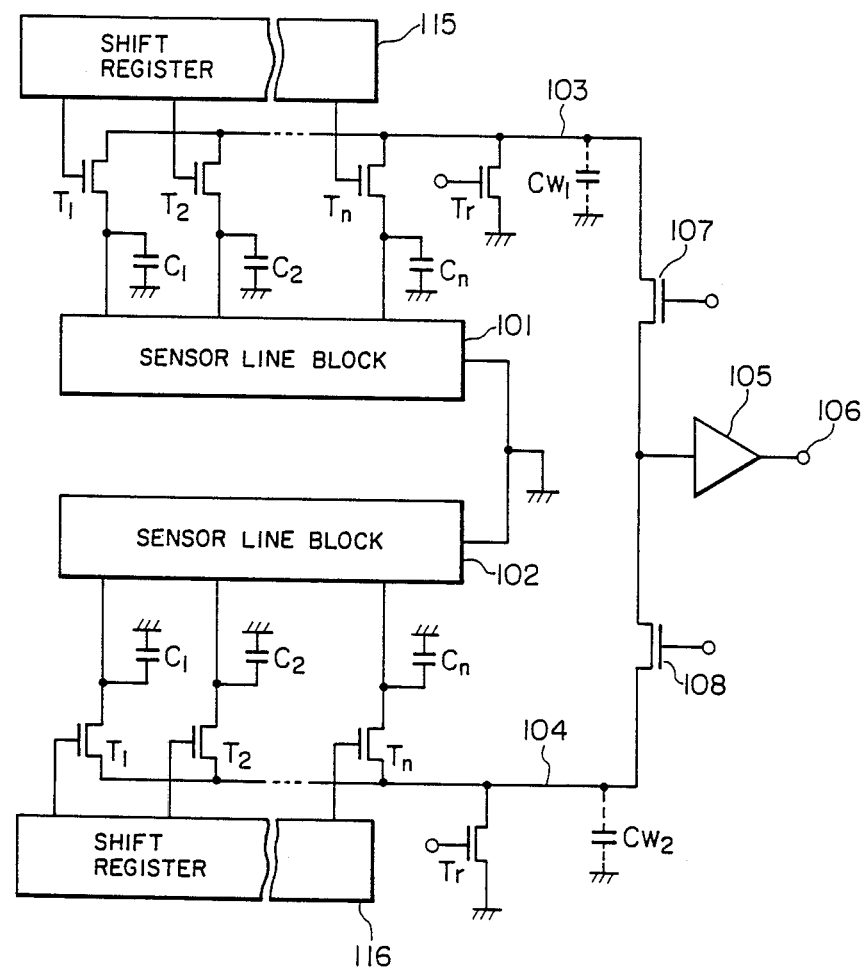
FIG. 2A is a schematic circuit diagram showing an embodiment of the photoelectric converting apparatus according to the present invention.

FIG. 2A is a schematic circuit diagram showing an embodiment of the photoelectric converting apparatus according to the present invention.

In the Figure, a signal output line 103 from which signals from a sensor line block 101 are sequentially outputted is connected to the input terminal of an amplifier 105 via switch means 107. Similarly, a signal output line 104 from which signals from a sensor line block 102 are sequentially outputted is connected to the input terminal of the amplifier 105 via switch means 108.

MOS transistors are used as switch means in this embodiment. However, other devices having a low conductive resistance such as analog switches may obviously be used.

Also, instead of two signal output lines, a larger number of signal output lines may be commonly connected to the input terminal of the amplifier 105 via switch means.

In operation of this embodiment, while signals from the sensor line block 101 are sequentially outputted to the signal output line 103 by means of a shift register 115, switch means 107 is kept turned on and switch means 108 is kept turned off. Therefore, the wiring capacitance of the signal output line 104 becomes substantially the wiring capacitance Cw1 of the signal output line 103 itself. Thus, if each capacitance C of charge storage capacitors C1 to Cn is set sufficiently large as compared with Cw1, then it becomes possible to read signals from sensors without reducing their signal level.

Conversely, while signals from the sensor line block 102 are read by means of a shift register 116, switch means 107 is kept turned off whereas switch means 108 is kept turned on. Similarly in this case, signals can be read without reducing their signal level.

Next, the structure and operation of the line sensor block in this embodiment will be described in more detail.

Figure 2B:
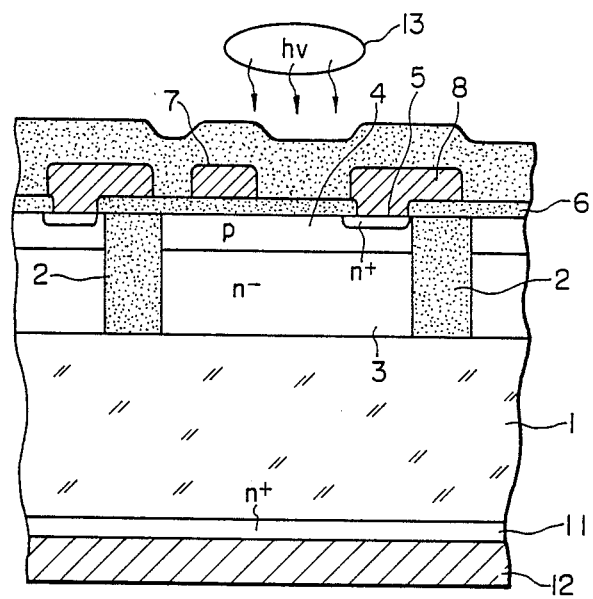
FIG. 2B is a schematic cross section of a photoelectric conversion cell disclosed in Japanese Patent Laid-open Gazette Nos. 12579/1985 and 12765/1985.
Figure 2C:
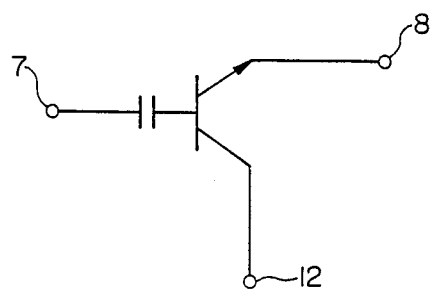
FIG. 2C is a equivalent circuit of the photoelectric conversion cell shown in FIG. 2B.

FIG. 2B is a schematic cross section of a photoelectric conversion cell disclosed in Japanese Patent Laid-open Gazettes Nos. 12759/1985 through 12765/1985, (corresponding to U.S. Pat. No. 4,686,554) and FIG. 2C is an equivalent circuit of the photoelectric conversion cell.

In the Figures, each photosensor cell is formed on an n+silicon substrate 1 and electrically isolated from adjacent photosensor cells by an element isolation region 2 made of, for example, $SiO_2$, $Si_3N_4$, polysilicon or the like.

Each photosensor cell has the following constituent elements: A p-region 4 is formed by doping p-type impurity on an n⁻-region 3 of low impurity concentration formed by the epitaxy method or the like. An n+-region 5 is formed in the p-region 104 by the impurity diffusion method, the ion implantation method or the like. The p-region 4 and n+-region 5 serve as the base and emitter of a bipolar transistor, respectively.

Formed on an oxide film 6 deposited on the n⁻-region 3 with the above regions is a capacitor electrode 7 of predetermined area which faces the p-region 4 with the oxide film 6 interposed therebetween. The potential of the p-region 104 in a floating state is controlled by a pulse voltage applied to the capacitor electrode 7.

The photosensor cell is constructed further of an emitter electrode 8 connected to the n+-region 5, an n+-region 11 of high impurity concentration formed on the substrate 1, and an electrode 12 supplying a potential to the collector of the bipolar transistor.

Next, the fundamental operations of the photosensor constructed as above will be described. First, assuming that the p-base region 4 of the transistor is at a negative potential and at a floating state. Upon incidence of light 13 to the p-region 4, holes of light-induced electron-/hole pairs are accumulated in the p-region 4 the potential of which rises positively due to the accumulated holes (accumulation operation).

Next, a readout positive pulse is applied to the capacitor electrode 7 so that a readout signal corresponding to a change in base potential during the accumulation operation is outputted from the emitter electrode (readout operation). Repetitive readout operations are possible because the accumulated charge amount in the base p-region 4 does not decrease to a large extent.

To remove accumulated holes in the p-region 4, the emitter electrode 8 is grounded and the capacitor electrode 8 is applied with a positive refresh pulse. With this pulse applied, the p-region 4 is forward biased relative to the n+-region 5 so that accumulated holes are removed. At the trailing edge of the refresh pulse, the p-region 4 takes again its initial negative potential (refresh operation). Thereafter, similar accumulation, readout and refresh operations are repeated.

Briefly stating the above proposed method, light-induced carriers are accumulated in the base p-region 4 to control a current passing through the emitter and collector electrodes 8 and 12 in accordance with the accumulated charge quantity. The accumulated carriers are read after amplifying them by the amplification function of each cell, thereby achieving a high output and sensitivity, and less noise.

The potential $V_p$ of the base with light-induced carriers (holes in this case) accumulated therein is given by Q/C, wherein Q represents the charge of carriers accumulated in the base region, and C represents a capacitor coupled to the base region. As apparent from the above equation, the values of Q and C both become small as the cell size becomes small due to high integration. Thus, the light-induced potential $V_p$ is maintained substantially constant Therefore, the above proposed method may become useful in the future for a means of obtaining a high resolution.

Figure 3A:
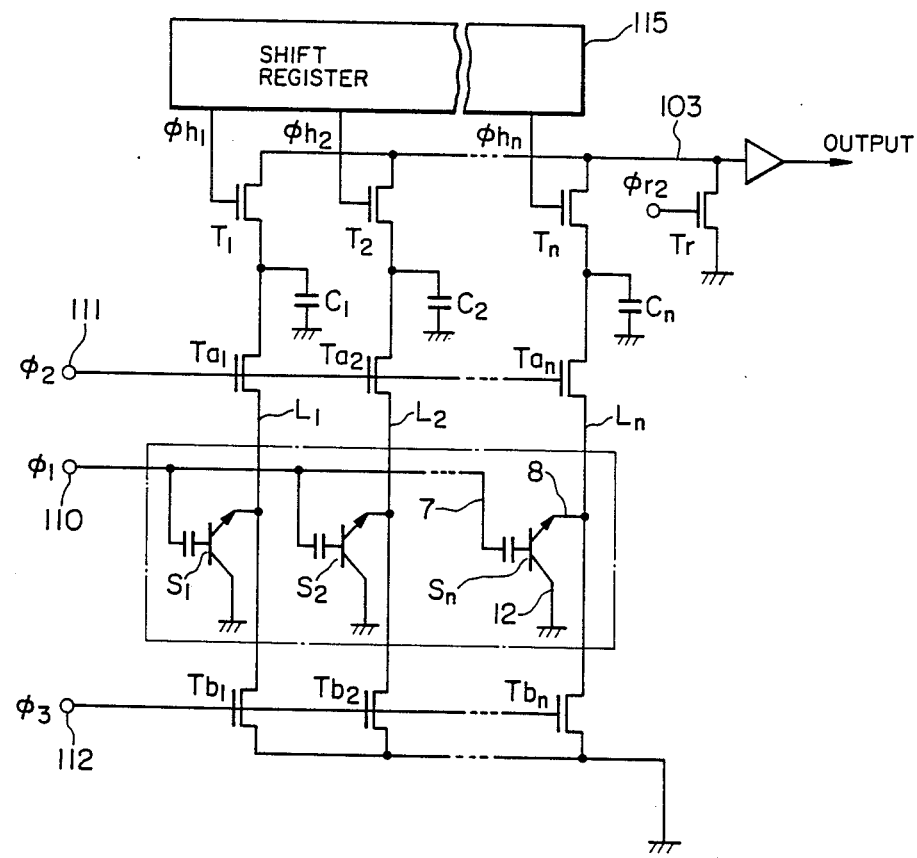
FIG. 3A is a circuit diagram showing an example of a driver for a sensor line block using the photoelectric conversion cells of FIG. 2B.
Figure 3B:
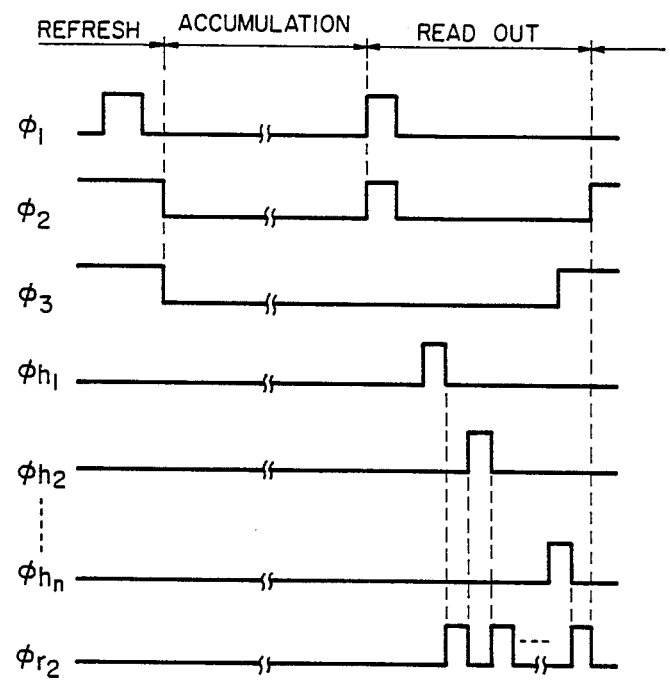
FIG. 3B is a timing chart for explaining the operation of the circuit shown in FIG. 3A.

FIG. 3A is a circuit diagram showing an example of a driver for the sensor line block using the above photoelectric conversion cells, and FIG. 3B is a timing chart for explaining the operation of the driver circuit.

Referring to FIG. 3A, each collector electrode 12 of the photoelectric conversion cells S1 to Sn is supplied with a predetermined voltage. Capacitor electrodes 7 are connected in common to a terminal 110 to which a signal $\phi_1$ for the readout and refresh operation is applied. Each emitter electrode 8 is connected to respective vertical lines L1 to Ln which are connected to one main electrodes of respective buffer transistors Ta1 to Tan.

The gate electrodes of the buffer transistors Ta1 to Tan are connected in common to a terminal 111 to which a signal $\phi_2$ is applied. The other main electrodes of the buffer transistors Ta1 to Tan are grounded via charge storage capacitors C1 to Cn serving as accumulation means, and also connected to the signal line 103 via transistors T1 to Tn. The gate electrodes of the transistors T1 to Tn are respectively connected to the parallel output terminals of the shift register from which signals $\phi h1$ to $\phi hn$ are sequentially outputted.

The signal output line 103 is grounded via transistor Tr for refreshing the signal output line 103. The gate electrode of the transistor Tr is supplied with a signal $\phi_{r2}$.

The vertical lines L1 to Ln are grounded via respective buffer transistors Tb1 to Tbn. The gate electrodes of the buffer transistors Tb1 to Tbn are connected in common to a terminal 112 to which a signal $\phi_3$ is applied.

Next, the operation of the embodiment constructed as above will be described with reference to the timing chart shown in FIG. 3B.

Refresh Operation

First, signals $\phi_2$ and $\phi_3$ are made high level to cause the buffer transistors Ta1 to Tan to turn on. Therefore, the emitter electrodes 8 of the photoelectric conversion cells S1 to Sn are grounded and residual charges in the charge storage capacitors C1 to Cn are removed therefrom. When signal $\phi_1$ becomes high level to apply a positive refresh voltage to the capacitor 7 of each photoelectric conversion cell, a refresh operation is performed as described before. When signal $\phi_1$ becomes low level, the base region 4 of each cell returns to its initial negative potential.

Accumulation Operation

Signals $\phi_2$ and $\phi_3$ are made low level to cause the buffer transistors Ta1 to Tan and Tb1 to Tbn to turn off. In this condition, holes of light-induced electron/hole pairs are accumulated in the base region 4 of each photoelectric conversion cell S1 to Sn so that the base potential of each cell rises to a higher value from the initial negative potential by the accumulated potential corresponding to the incident light amount.

Readout Operation

When signals $\phi_1$ and $\phi_2$ are made high level, signals read from the emitter electrodes 8 of the photoelectric conversion cells S1 to Sn are accumulated at the same time in the charge storage capacitors C1 to Cn via the buffer transistors Ta1 to Tan.

Succeedingly, after signals $\phi_1$ and $\phi_2$ are made low level, a readout operation for each signal from the signal output line 103 starts.

First, when high level signal $\phi h1$ is outputted from the shift register, the transistor T1 is caused to turn on. Then, a signal of the photoelectric conversion cell S1 stored in the charge storage capacitor C1 appears on the signal output line 103, and read out from the signal output terminal 106 via switch means 107 and the amplifier 105 as described previously.

Succeedingly, signal $\phi_{r2}$ is made high level to cause the transistor Tr to turn on. Thus, residual charge on the signal output line 103 is removed via the transistor Tr to effect a refresh operation.

Thereafter, high level signals $\phi h2$ to $\phi hn$ are sequentially outputted in a similar manner as above to cause the transistors to sequentially turn on. Thus, signals stored in the charge storage capacitors C2 to Cn are sequentially outputted on the signal output line 103. Each time after a signal has been outputted to the external circuit, signal $\phi_{r2}$ is made high level to refresh the signal output line 103.

After all the signals stored in the charge storage capacitors C1 to Cn have been read out to the external circuit, the above-described refresh operation is carried out, and the similar accumulation and readout operations follow.

While the sensor line block 101 is read, switch means 107 is turned on and switch means 108 is turned off.

Conversely, while the sensor line block 102 is read, switch means 107 is turned off and switch means 108 is turned on.

The type of photosensor is not limited to the above embodiment but photosensors such as photoconductive type sensors, photodiodes, static induction transistors, etc. may be used.

Figure 4:
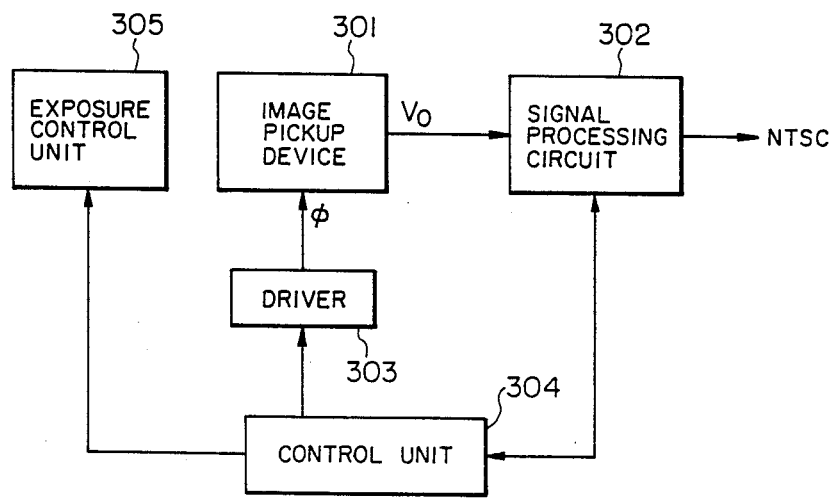
FIG. 4 is a block diagram showing an example of an image pickup apparatus using the embodiment of FIG. 3A.

FIG. 4 is a block diagram showing an example of an image pickup apparatus using the above embodiment. In this case, it is needless to say that a number of sensor line blocks are provided and switch means is provided for each sensor line block.

In the Figure, an image pickup device 301 has a similar construction to the above embodiment. The output signal Vo therefrom is processed including a gain adjustment by a signal processing circuit 302 to output it as a standard television signal in the form of NTSC signal or the like.

Various types of pulses for driving the image pick-up device 301 are supplied from a driver 303 which is controlled by a control unit 304. The control unit 304 adjusts a gain and the like of the signal processing circuit 302 in accordance with an output from the image pickup device, and adjusts the incident light amount to the image-pickup device 301 by controlling an exposure control unit 305.

As described in detail, each signal output line of the photoelectric converter of the above embodiment according to the present invention is coupled to the output terminal via switch means. Therefore, a wiring capacitance on a signal output line from which a signal is outputted via closed switch means is greatly reduced as compared with a conventional one, by opening switch means on the other signal output lines. Hence, it is possible to prevent lowering the level of a signal outputted from the signal output line.

Next, a second embodiment of the present invention will be described in detail with reference to the associated drawings.

Figure 5:
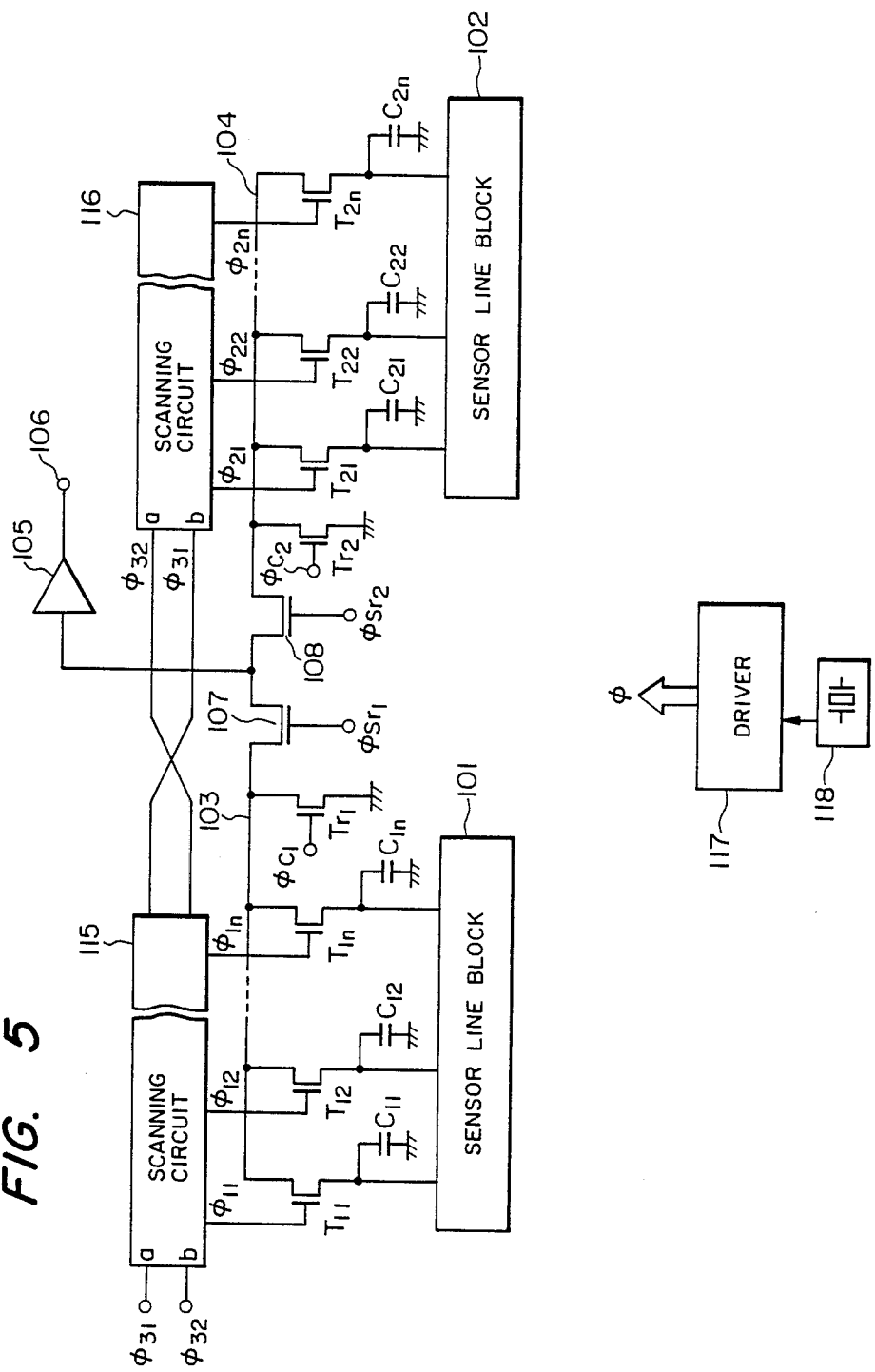
FIG. 5 is a schematic circuit diagram showing an embodiment of the photoelectric converting apparatus according to the present invention.

FIG. 5 is a schematic circuit diagram showing an embodiment of the photoelectric converter according to the present invention.

In this embodiment, there are provided sensor line blocks 101 and 102 each having a plurality of n photosensors. Each sensor line block is intended herein to include the concept wherein it represents odd/even lines of a sensor group such as an area sensor, or it represents odd/even photosensors on an arbitrary line, and the like. In this embodiment, for the purpose of convenience of description, two sensor blocks are shown.

In the Figure, n output terminals of the sensor line block 101 are connected to capacitors C11 to C1n and connected in common to a signal output line 103 via transistors T11 to T1n. Each gate electrode of transistor T11 to T1n is inputted with pulses $\phi_{11}$ to $\phi_{1n}$ from a scanning circuit 115. Pulses $\phi_{31}$ and $\phi_{32}$ are inputted to input terminal a and b of the scanning circuit 115.

The signal line 103 is grounded via transistor Tr1 and connected to the input terminal of an amplifier 105 via a transistor 107 serving as switch means. A pulse $\phi_{c1}$ is inputted to the gate electrode of the transistor Tr1, and a pulse $\phi_{sr1}$ is input to the gate electrode of the transistor 107.

The sensor line block 102 is constructed in a similar manner. N output terminals of the sensor line block 102 are connected to capacitors C21 to C2n and connected in common to a signal output line 104 via transistors T21 to T1n. Each gate electrode of transistor T21 to T2n is inputted with pulse $\phi_{21}$ to $\phi_{2n}$ from a scanning circuit 116. Pulses $\phi_{32}$ and $\phi_{31}$ are inputted to input terminal a and b of the scanning circuit 116, as opposed to the case of the scanning circuit 115.

The signal line 104 is grounded via transistor Tr2 and connected to the input terminal of the amplifier 105 via a transistor 108 serving as switch means. A pulse $\phi_{c2}$ is inputted to the gate electrode of the transistor Tr2, and a pulse $\phi_{sr2}$ is inputted to the gate electrode of the transistor 108.

The operation of the scanning circuits 115 and 116 of this embodiment is as follows.

Figure 6:
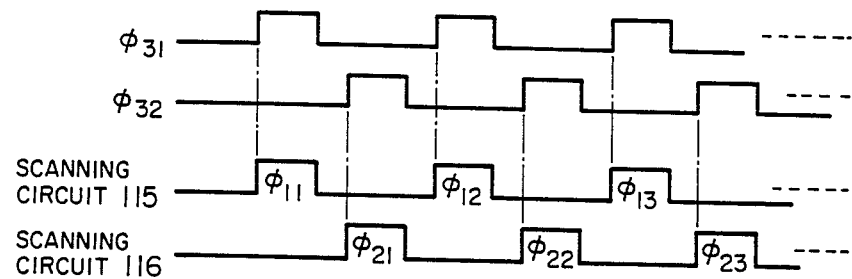
FIG. 6 is a timing chart for explaining the operation of the scanning circuit.

FIG. 6 is a timing chart illustrating the operation of the scanning circuit.

The scanning circuits 115 and 116 are two-phase driven by pulses $\phi_{31}$ and $\phi_{32}$. With the interconnection shown in FIG. 5, pulses $\phi_{11}$ to $\phi_{1n}$ are outputted from the scanning circuit 115 in synchronization with the pulse $\phi_{31}$, whereas pulses $\phi_{21}$ to $\phi_{2n}$ are outputted from the scanning circuit 116 in synchronization with the pulse $\phi_{32}$, respectively as shown in the timing chart. Therefore, based on the timings of pulses $\phi_{31}$ and $\phi_{32}$, the scanning circuits 115 and 116 can independently or alternately be operated at desired timings.

The above-described various pulses are supplied from a driver 117 which outputs a pulse at the timing in synchronization with a clock signal from an oscillator 118.

Transistors 107 and 108 are used as switch means in this embodiment. However, obviously other devices having a low conductive resistance such as analog switches may be used similar to the embodiment shown in FIG. 2.

It is to be understood that the invention includes the arrangement wherein three or more sensor line blocks are provided and the signal output lines are connected in common to the input terminal of the amplifier 109 via respective switch means.

Figure 7:
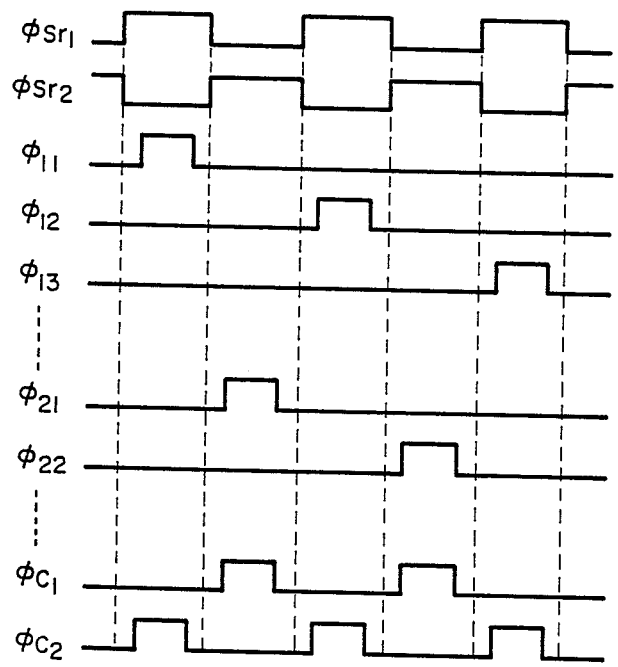
FIGS. 7, 8, 9 and 10 are timing charts showing first to fourth examples of timings of pulses outputted from the driver 117.

Next, the operation of this embodiment will be described with reference to FIG. 7 which shows a timing chart illustrating a first example of timings of pulses outputted from the driver 117.

In the Figure, first, pulse $\phi_{sr1}$ is made high level and pulse $\phi_{sr2}$ is made low level to turn on the transistor 107 and turn off the transistor 108.

In this condition, pulse $\phi_{11}$ is outputted from the scanning circuit 115 to turn on the transistor T11. Thus, a signal at the first cell of the sensor line block 101 is picked up from the capacitor C11 onto the signal output line 103, and hence to the external circuit via the transistor 107, the amplifier 105 and the output terminal 106.

Simultaneously with the pulse $\phi_{11}$, pulse $\phi_{c2}$ is made high level to turn on the transistor Tr2 so that residual charge on the signal output line 104 is removed.

After the signal at the first cell of the sensor block 101 has been outputted, then pulses $\phi_{sr1}$ and $\phi_{sr2}$ are inverted respectively to low level and high level to turn off the transistor 107 and turn on the transistor 108.

In this condition, pulse $\phi_{21}$ is outputted from the scanning circuit 116 to turn on the transistor T21. Then a signal at the first cell of the sensor line block 102 is picked up from the capacitor C21 onto the signal output line 104, and hence to the external circuit via the transistor 108 and the amplifier 105.

Simultaneously with pulse $\phi_{21}$, pulse $\phi_{c1}$ is made high level to turn on the transistor Tr1 and remove residual charge present at the preceding signal on the signal output line 103.

Thereafter, in a similar manner as above, signals from the sensors in the sensor line blocks 101 and 102 are alternately and sequentially outputted to the external circuit in response to pulses $\phi_{11}$ to $\phi_{1n}$ from the scanning circuit 115 and pulses $\phi_{22}$ to $\phi_{2n}$ from the scanning circuit 116.

It is to be noted that the wiring capacitance on a signal output line from which a signal is read is substantially the wiring capacitance Cw of the line itself because one of the transistors 107 and 108 from which a signal is not read is turned off. Thus, by setting each capacitance C of the capacitors C11 to C1n and C21 to C2n sufficiently larger than Cw, it becomes possible to read a signal from a cell without greatly reducing its signal level.

Further, since each sensor line block 101 and 102 is provided with respective scanning circuit 115 and 116, the scanning circuit can be driven at a lower operating frequency corresponding to n photosensors although 2n photosensors are used, thus leading to a high degree of freedom in design.

By changing the timings of pulses $\phi_{31}$ and $\phi_{32}$ applied to the scanning circuits, the following drive methods can be used.

Figure 8:
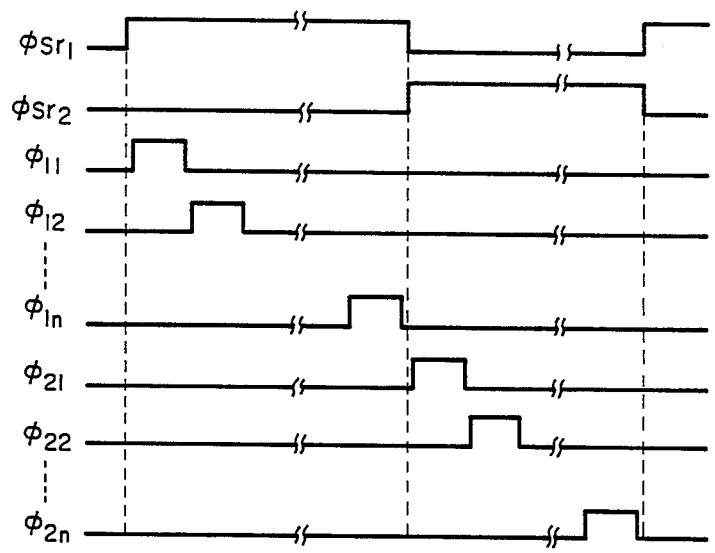

FIG. 8 is a timing chart showing a second example of timings of pulses outputted from the driver 117.

In the second example, photosensors in the sensor line blocks 101 and 102 are sequentially read one block at a time. Namely, the transistor 107 is turned on and the transistor 108 is turned off by applying pulses $\phi_{sr1}$ and $\phi_{sr2}$. In this condition, pulses $\phi_{11}$ to $\phi_{1n}$ are sequentially outputted from the scanning circuit 115 to read all the signals from the cells in the sensor line block 101. Similarly, the transistor 107 is turned off and the transistor 108 is turned on to read all the signals from the sensor line block 102.

Figure 9:
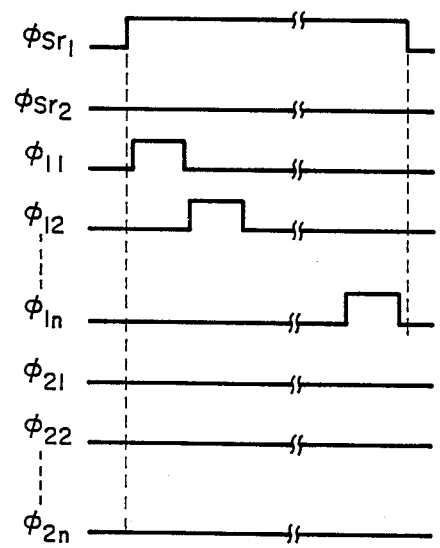
Figure 10:
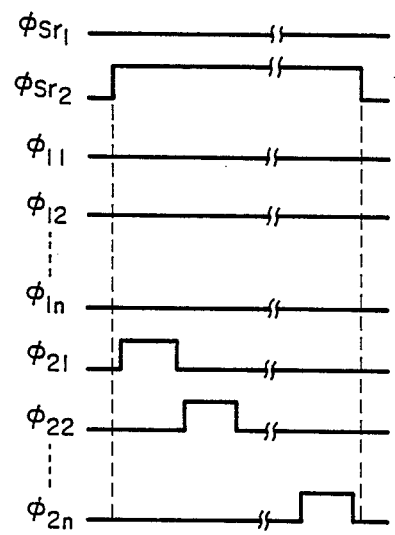

FIGS. 9 and 10 are timing charts showing the third and fourth examples of timings of pulses outputted from the driver 117.

As seen from the timing charts, signals can be read from only one of the sensor line blocks by keeping the other scanning circuit turned off.

As appreciated from the foregoing detailed description of the photoelectric converting apparatus according to the present invention, a plural number of selection means for selecting photosensors in sensor line blocks are provided. Therefore, even if a high frequency operation is required for a large number of photosensors, selection means can be operated at a lower frequency, resulting in a high degree of freedom in circuit design, pattern design for semiconductor devices, and the like.

Further, each signal output line is connected to the signal output terminal via switch means. During the picking up of a signal from a signal output line, switch means for this line are closed whereas switch means for the other lines are opened. Therefore, it is possible to prevent lowering the level of a signal picked up from the signal output line, and to readily realize a high resolution and high output image pickup apparatus.

What is claimed is:

1. A photoelectric converting apparatus comprising:
   (a) a plurality of sensor blocks each having a plurality of photoelectric conversion cells;
   (b) a plurality of scanning means each capable of independently scanning an associated sensor block;

(c) common amplification means for amplifying the signals from the sensor blocks;

(d) switch means for selectively directing a signal from each sensor block to said common amplification means; and (e) reset means for resetting the signal from each sensor block which is directed to said common amplification means to a predetermined level after the scanning of each photoelectric conversion cell.

2. A photoelectric converting apparatus according to claim 1, further comprising a plurality of capacitors for temporarily storing a signal from each of said photoelectric conversion cells.

3. A photoelectric converting apparatus according to claim 1, wherein each photoelectric conversion cell includes a bipolar transistor.

4. A photoelectric converting apparatus according to claim 1, wherein said each sensor block has an output signal line.

5. A photoelectric converting apparatus according to claim 1, wherein said plurality of scanning means scan alternately.

6. A photoelectric converting apparatus according to claim 4, wherein said switch means is coupled between said common output signal line and said amplification means.

7. A photoelectric converting apparatus according to claim 6, further comprising clear means for clearing a signal on said output signal line.

8. A photoelectric converting apparatus according to claim 5, wherein said scanning means scans a signal from a photoelectric conversion cell alternately in one sensor block and then in another sensor block.

9. A photoelectric converting apparatus according to claim 15, wherein after said scanning means has completed a scan of all the signals from one sensor block, said scanning means starts scanning all the signals from another sensor block.

10. A photoelectric converting apparatus comprising:

(a) a plurality of sensor blocks each having a plurality of photoelectric conversion cells;

(b) scanning means for scanning said plurality of sensor blocks by alternately scanning a photoelectric conversion cell from a different block;

(c) common amplification means for amplifying signals from said sensor blocks; and (d) switch means for selectively directing one signal at a time from said sensor blocks to said common amplification means in response to the scanning of said scanning means.

11. A photoelectric converting apparatus according to claim 10, further comprising:

(a) reset means for resetting the signal from each sensor block which is directed to said common amplification means to a predetermined level after the alternate scanning of each photoelectric conversion cell.

12. A photoelectric converting apparatus according to claim 10, further comprising a capacitor for temporarily storing a signal from at least one photoelectric conversion cell.

13. A photoelectric converting apparatus according to claim 10, wherein each photoelectric conversion cell includes a bipolar transistor.

14. A photoelectric converting apparatus according to claim 10, wherein said each sensor block has an output signal line.

15. A photoelectrically converting apparatus according to claim 14, wherein said switch means is coupled between the output signal lines and said common amplification means.

16. A photoelectric converting apparatus according to claim 15, further comprising clear means for clearing a signal n at least one output signal line.

17. A photoelectric converting apparatus comprising:

(a) a plurality of line sensors, each line sensor having a common output line and scanning means for scanning the corresponding line sensor;

(b) selection means for selectively directing a signal on a common output line for each line sensor to a common output terminal; and (c) reset means for resetting said common output line, after its signal has been directed to the common output terminal; to a predetermined level in response to the scanning of the associated scanning means.

18. A photoelectric converting apparatus according to claim 17, wherein said scanning means includes a shift register.

19. A photoelectric converting apparatus according to claim 17, wherein said selection means is coupled between said output line and said common output terminal.

20. A photoelectric converting apparatus according to claim 19, wherein said selection means performs a selection operation by selecting one of the output lines.

21. A photoelectric converting apparatus according to claim 20, wherein said selection means performs a selection operation, during the scanning of all the signals from a line sensor, by selecting a corresponding output line for said line sensor.

22. A photoelectric converting apparatus according to claim 20, wherein said scanning means alternately scans a part of each line sensor, and wherein said selection means selects a corresponding one among said output lines only during the scanning of each line sensor.

* * * * *